(12) United States Patent  (10) Patent No.: US 8,175,296 B2
Cummings  (45) Date of Patent: May 8, 2012

(54) ARTICULATED AMPLIFIER

(76) Inventor: Karl Cummings, Winnetka, CA (US)

( * ) Notice: Subject to any disclaimer, the term of this patent is extended or adjusted under 35 U.S.C. 154(b) by 756 days.

(21) Appl. No.: 12/237,209

(22) Filed: Sep. 24, 2008

(65) Prior Publication Data

US 2009/0196439 A1  Aug. 6, 2009

Related U.S. Application Data

(60) Provisional application No. 61/025,577, filed on Feb. 1, 2008.

(51) Int. Cl.
H03F 99/00 (2009.01)

(52) U.S. Cl. ........................................ 381/120; 330/127
(58) Field of Classification Search .................. 381/120; 330/127
See application file for complete search history.

(56) References Cited

U.S. PATENT DOCUMENTS 3,860,755 A * 1/1975 Kimbell et al. ............... 381/109

* cited by examiner

Primary Examiner — Steven J Fulk
(74) Attorney, Agent, or Firm — James A. Italia; Italia IP

(57) ABSTRACT

An audio amplifier having a variably configurable housing, which may be mounted to an interior surface of a motor vehicle. The housing is formed in two complementing housing sections mutually joined by a hinge, tether, or other connector. A power supply is contained in one housing section and an audio output module is contained in the other housing section. The power supply and audio output module may be connected by flexible signal conductors to accommodate pivot of the two housing sections relative to one another. A heat sink comprising cooling fins and communications and power terminals may be disposed on the exterior of the housing sections to enable conventional connection to an associated audio system. The hinge may incorporate a fixing element which releasably holds the two housing sections at a selected degree of pivot.

8 Claims, 7 Drawing Sheets

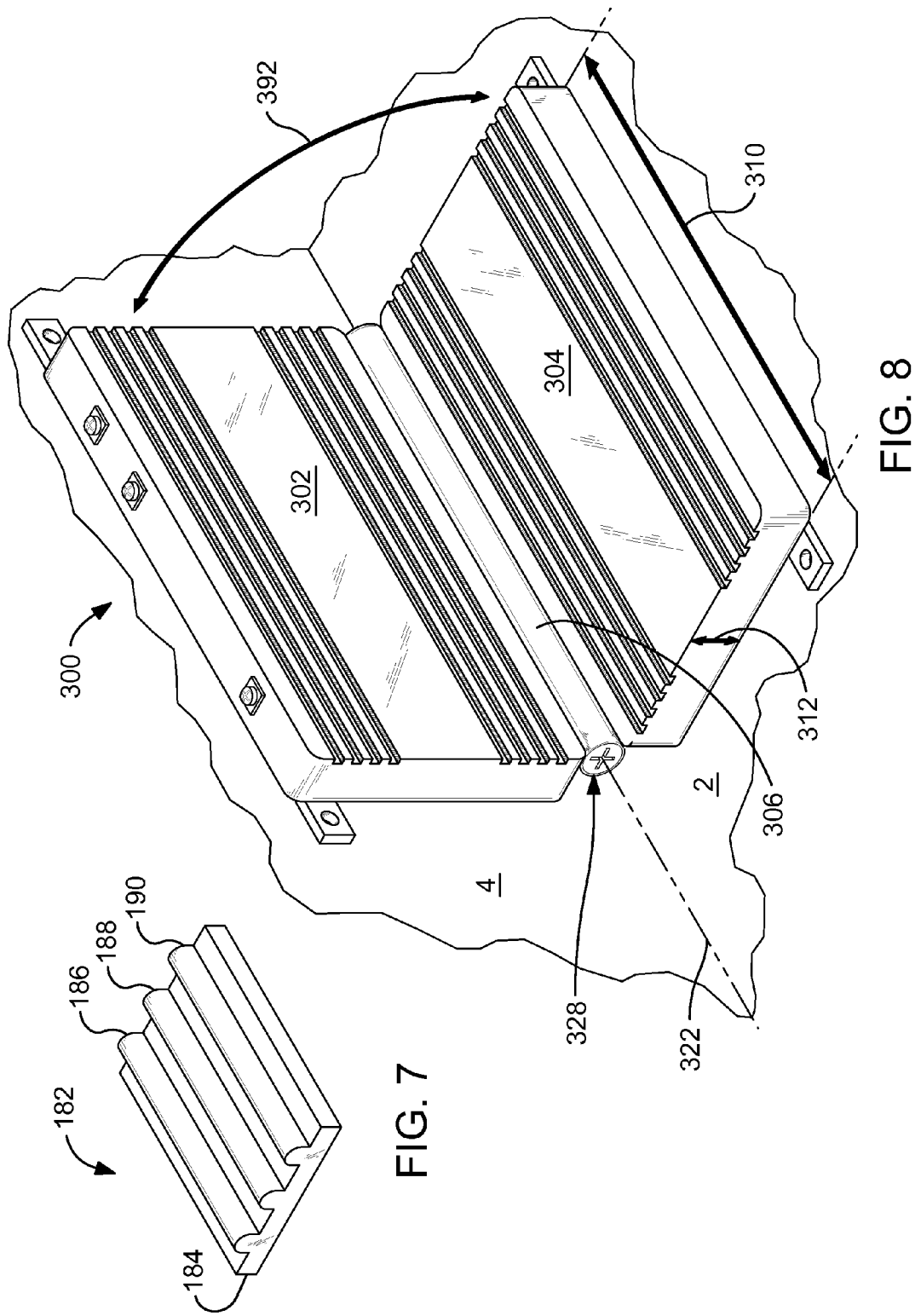

ARTICULATED AMPLIFIER

CROSS-REFERENCE TO RELATED APPLICATION

This application claims the benefit of the filing date under 35 USC 119(e) of the filing date of U.S. Provisional Application Ser. No. 61/025,577, filed Feb. 1, 2008, the contents of which are incorporated herein by reference.

FIELD OF THE INVENTION

The present invention relates to amplifiers for audio sound systems, and more particularly to an amplifier which is fabricated in a two-piece housing, wherein the two pieces are hinged to one another.

BACKGROUND OF THE INVENTION

Vehicular audio sound systems and components thereof are widely available as aftermarket devices intended to be installed in a motor vehicle which has been purchased by a consumer. The components of sound systems are typically made available to the public by manufacturers who are specialists in their field, and who are not manufacturers of automobiles. The sound system components are intended for installation in the vehicular products of many different manufacturers and models of vehicles. Therefore, the components are not designed with precise fit within any particular vehicle.

Components such as amplifiers are typically installed in motor vehicles in areas which offer a generally protected and concealed location. A typical example is in the trunk of an automobile. However, the nature of spaces that are protected and concealed, given that automobile surfaces may be irregularly contoured, may result in an otherwise suitable space or location within a vehicle that is nearly but not quite adequate for installing a component such as an amplifier flush against a structural wall of the vehicle body.

This leaves the audio installer with a problem as to how best cope with this misfit. One answer is to mount a component such as an amplifier spaced apart from a body wall. Such a mounting may well forego the benefits of nesting the component securely against the wall. For example, the component may project into used or occupied space such that it risks damage by contact with objects being stored in the vehicle. This not only risks damage to the component, but also intrudes into and renders less useful the selected area of the vehicle. The component may also become objectionably conspicuous or exposed to view.

Misfit may occur even where a manufacturer has left space for a component such as an amplifier. For example, the space designed into a vehicle body may have a footprint of ten inches by twelve inches, whereas a particular amplifier may have footprint dimensions of eight inches by sixteen inches.

A need exists in the prior art for a component such as an audio amplifier which displays ability to accommodate differently configured and dimensioned mounting spaces within motor vehicles.

SUMMARY OF THE INVENTION

The present invention answers the above need by providing an amplifier which is adjustable as to its outer configuration, yet which mounts to the vehicle and connects to wiring systems conventionally. To these ends, a novel amplifier is provided wherein the housing is formed in two mating, mutually hinged parts. The hinge may have a manually releasable fastener disposed to secure the two parts in a selected relationship. A power supply is housed in one section and the output module is housed in the other section. The power supply is connected to the output module by a flexible cable long enough to accommodate significant pivot of the two housing sections about the hinge.

Advantages of this arrangement are firstly, that the installation footprint or outer configuration of the amplifier is adjustable, so that many previously unusable spaces in vehicle bodies can now be utilized for mounting the amplifier, and secondly, that physical separation of the power supply from the output module reduces distortions to reproduced sounds due to unwanted inputs from electromagnetic fields to the output module from the power supply. Mounting tabs for fastening the amplifier to vehicle surfaces, and terminals for accepting a wiring harness may remain conventional.

It is an object of the invention to provide an amplifier which displays adjustability in its outer configuration, to better conform to limited or irregular spaces for mounting in a motor vehicle.

A further object of the invention is to be able to secure the parts of the amplifier in a selected configuration.

Another object of the invention is to isolate the power supply from the output module to reduce distortion of reproduced sound.

It is an object of the invention to provide improved elements and arrangements thereof by apparatus for the purposes described which is inexpensive, dependable, and fully effective in accomplishing its intended purposes.

These and other objects of the present invention will become readily apparent upon further review of the following specification and drawings.

BRIEF DESCRIPTION OF THE DRAWINGS

Various objects, features, and attendant advantages of the present invention will become more fully appreciated as the same becomes better understood when considered in conjunction with the accompanying drawings, in which like reference characters designate the same or similar parts throughout the several views, and wherein:

FIG. 7 is a perspective detail view of a heat sink which may be employed with an amplifier according to an aspect of the invention.

FIG. 8 is an environmental perspective view of an amplifier which is adjustable as to outer configuration, according to at least one further aspect of the invention.

DETAILED DESCRIPTION

Figure 1:
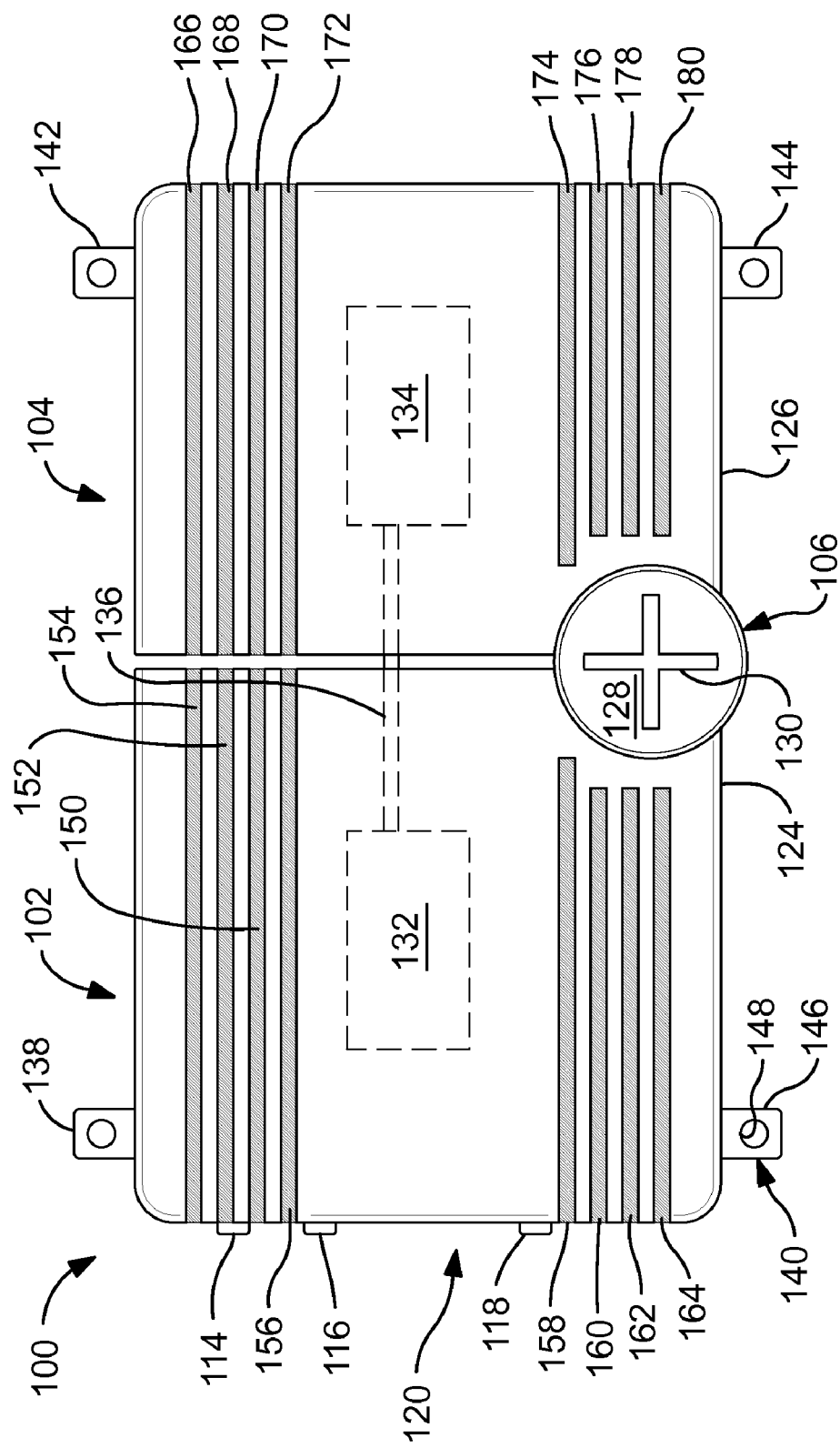
FIG. 1 is a top plan view of an amplifier which is adjustable as to outer configuration, according to at least one aspect of the invention.

FIG. 1 shows an amplifier 100 which is adjustable as to outer configuration, comprising a housing which further comprises a first housing section 102 and a second housing section 104. A hinge 106 which may be disposed to pivotably connect the first housing section 102 to the second housing section 104 may be located at the periphery of the first housing section 102 and the second housing section 104.

Figure 3:
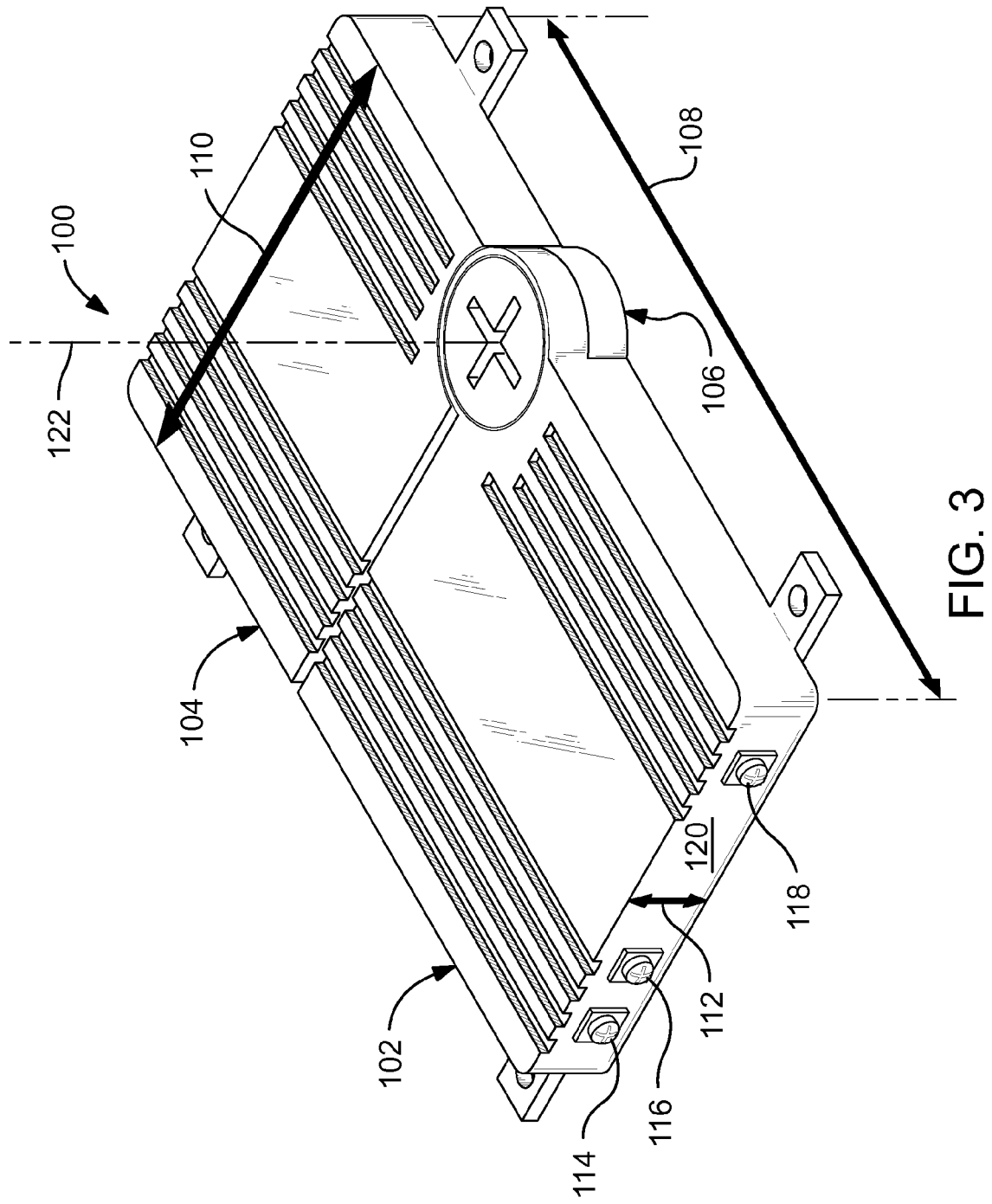
FIG. 3 is a diagrammatic perspective view of the amplifier of FIG. 1.

Turning now to FIG. 3, the housing of the amplifier 100 is seen to have an overall length 108, an overall width 110, and an overall height 112 which may be less in magnitude than those of the length 108 and the width 110. The height 112, shown at the first housing section 102, may be about equal to that of the second housing section 104, with the consequence that the overall configuration of the amplifier 100 as seen in FIGS. 1 and 3 may, apart from the hinge 106, be described as that of a rectangular slab or parallelepiped. It will also be seen in FIG. 3 that the overall height 112 may be less in magnitude than those of the overall length 108 and the overall width 110.

Electrical terminals 114, 116, and 118 may be disposed along that face 120 of the first housing section 102 which shows the height 112. The electrical terminals 114, 116, 118 may for example respectively accommodate connection to an audio input signal, an audio output signal, and electrical power.

Returning to FIG. 1, the hinge 106 may be of any known type which enables the first housing section 102 to pivot about a rotational axis 122 (see FIG. 3) relative to the second housing section 104. The rotation axis 122 may extend in the direction of the height 112 of the first housing section 102 and of the second housing section 104. The hinge 106 may be located at the periphery 124 of the first housing section 102 and at the periphery 126 of the second housing section 104. The hinge 106 may comprise a setscrew of which the head 128 is visible in FIG. 1. The arrangement including the setscrew functions as a fixing element disposed to secure the first housing section 102 to the second housing section 104 in a selected mutual orientation. The head 128 may bear a slot such as the cruciform slot 130 is dimensioned and configured to be driven by a screwdriver such as a phillips head screwdriver (not shown) to secure the first housing section 102 and the second housing section 104 in selected mutual orientations, and to release the first housing section 102 and the second housing section 104 from the selected mutual orientations.

The first housing section 102 may contain a power supply 132 which is dimensioned and configured to be received within and housed by the first housing section 102. The second housing section may contain an audio output module 134 which is dimensioned and configured to be received within and housed by the second housing section 104. Electrically operated functional components (such as the power supply 132) of the first housing section 102 may be connected to the functional components (such as the audio output module 134) of the second housing section 104 by a flexible cable 136. It should be understood that the flexible cable 136 is merely representative of any form of flexible circuitry which may be disposed to operably connect the electrical components of the amplifier 100. The flexible cable 136 may contain as many individual conductors as may be necessary or desirable to accomplish functional connection of the components. These conductors may be bundled together as one, as is represented by the flexible cable 136, or may comprise separated conductors (not shown), which may be spaced apart from one another.

The first housing section 102 may comprise mounting feet or tabs 138, 140, each of which may project from the first housing section 102 in a direction perpendicular to the height 112 of the first housing section 102. Likewise, the second housing section 104 may comprise mounting feet or tabs 142, 144 which may project from the second housing section 104 in a direction perpendicular to the height 112 of the second housing section 104. Each mounting tab such as any or all of the mounting tabs 138, 140, 142, 144 may comprise a generally planar member such as the member 146 bearing a hole such as the hole 148 extending through the member 146, for receiving a fastener such as a screw (not shown).

The first housing section 102 may comprises at least one cooling fin such as the cooling fins 150, 152, 154, 156, 158, 160, 162, 164 thereon. Similarly, the second housing section 104 may comprise at least one cooling fin thereon, such as the cooling fins 166, 168, 170, 172, 174, 176, 178, 180. The fins such as any or all of the fins 150 . . . 180 may comprise part of a heat sink such as the heat sink 182, seen in FIG. 7. The heat sink 182 may comprise a heat conductive base plate or substrate 184 from which project fins 186, 188, 190, which fins 186, 188, 190 may project to the exterior of a housing section such as the housing section 102 to dissipate heat generated by operation of electrical and electronic components of the amplifier 100, such as the power supply 132 and the audio output module 134.

Figure 2:
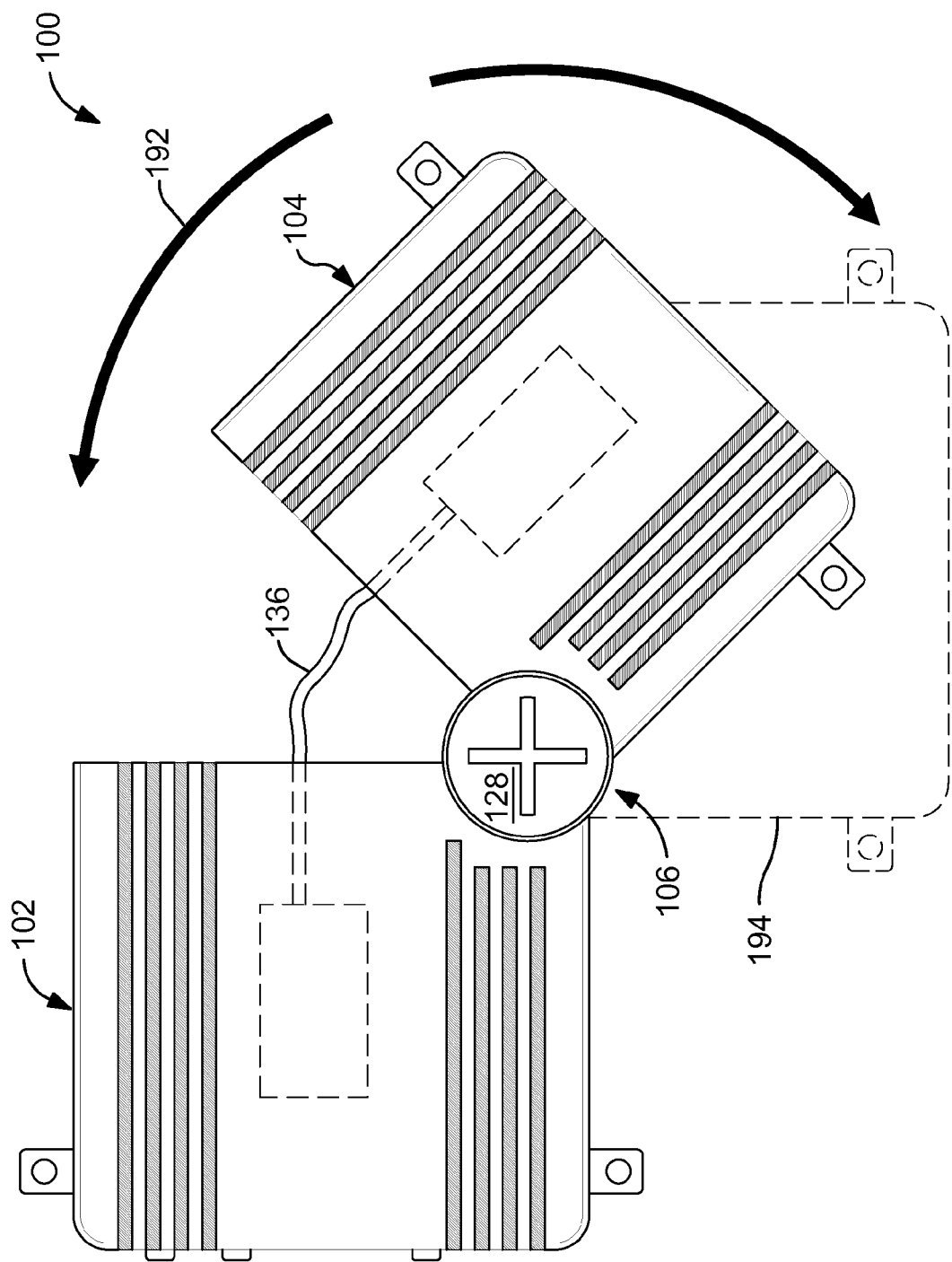
FIG. 2 is a top plan view of the amplifier of FIG. 1, showing an outer configuration which is adjusted from that shown in FIG. 1.

FIG. 2 shows adjustment of the outer configuration of the amplifier 100. The second housing section 104 may be pivoted relative to the first housing section 102 throughout a continuous range of adjustment represented by the arrow 192. The range of adjustment may extend such that with the first housing section 102 remaining its location illustrated in FIG. 2, the second housing section 104 may be swung such that it moves to the position indicated by the broken line 194. The amount of pivot may exceed that shown and described herein if desired. The first housing section 102 and the second housing section 104 may be releasably locked for fixed in a selected configuration by tightening the setscrew 128, which bears on the hinge 106 in a way to selectively prevent and enable rotation of the components of the hinge 106.

It will be seen that the overall length (corresponding to the length 108) of the amplifier 100 is less and the overall width (corresponding to the width 110) is greater in the configuration shown in FIG. 2 than were the case with the configuration shown in FIG. 1.

Figure 4:
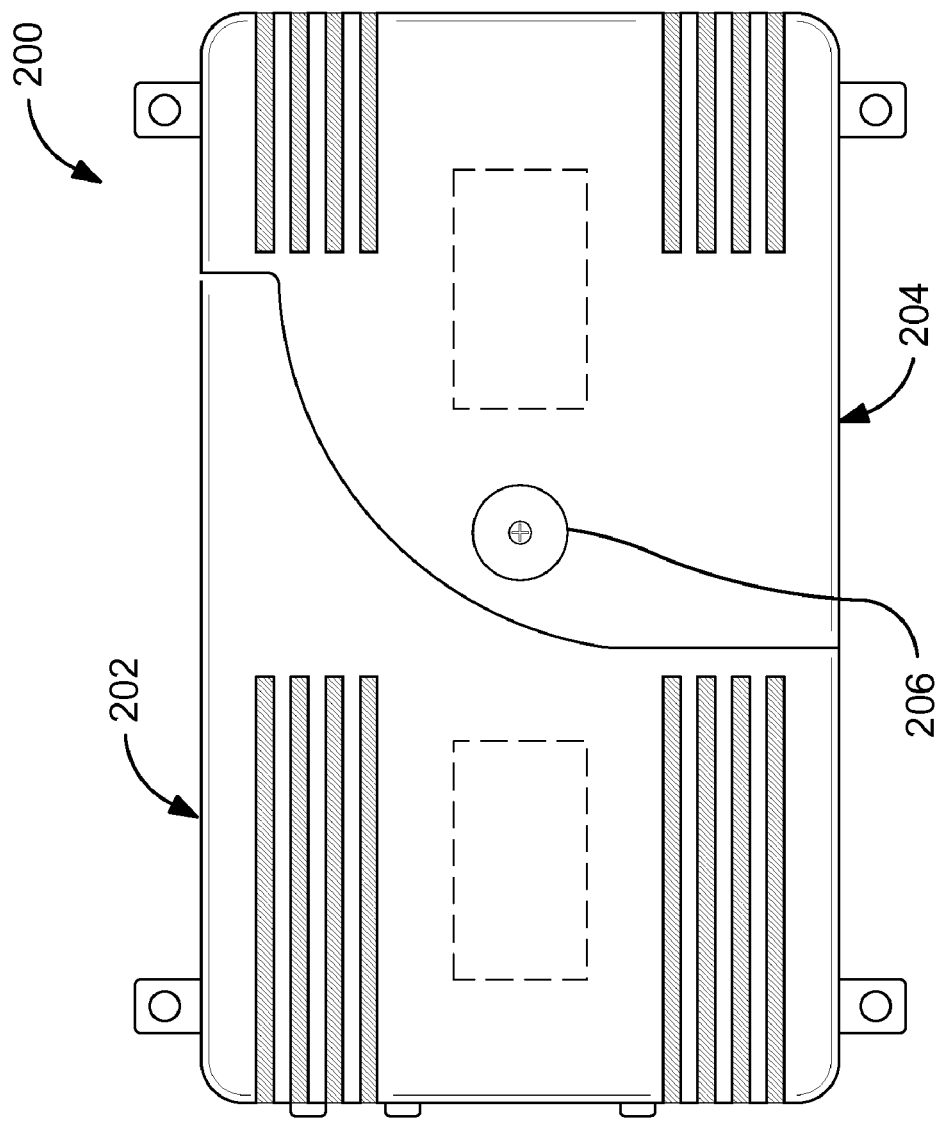
FIG. 4 is a top plan view of an amplifier which is adjustable as to outer configuration, according to at least one further aspect of the invention.
Figure 6:
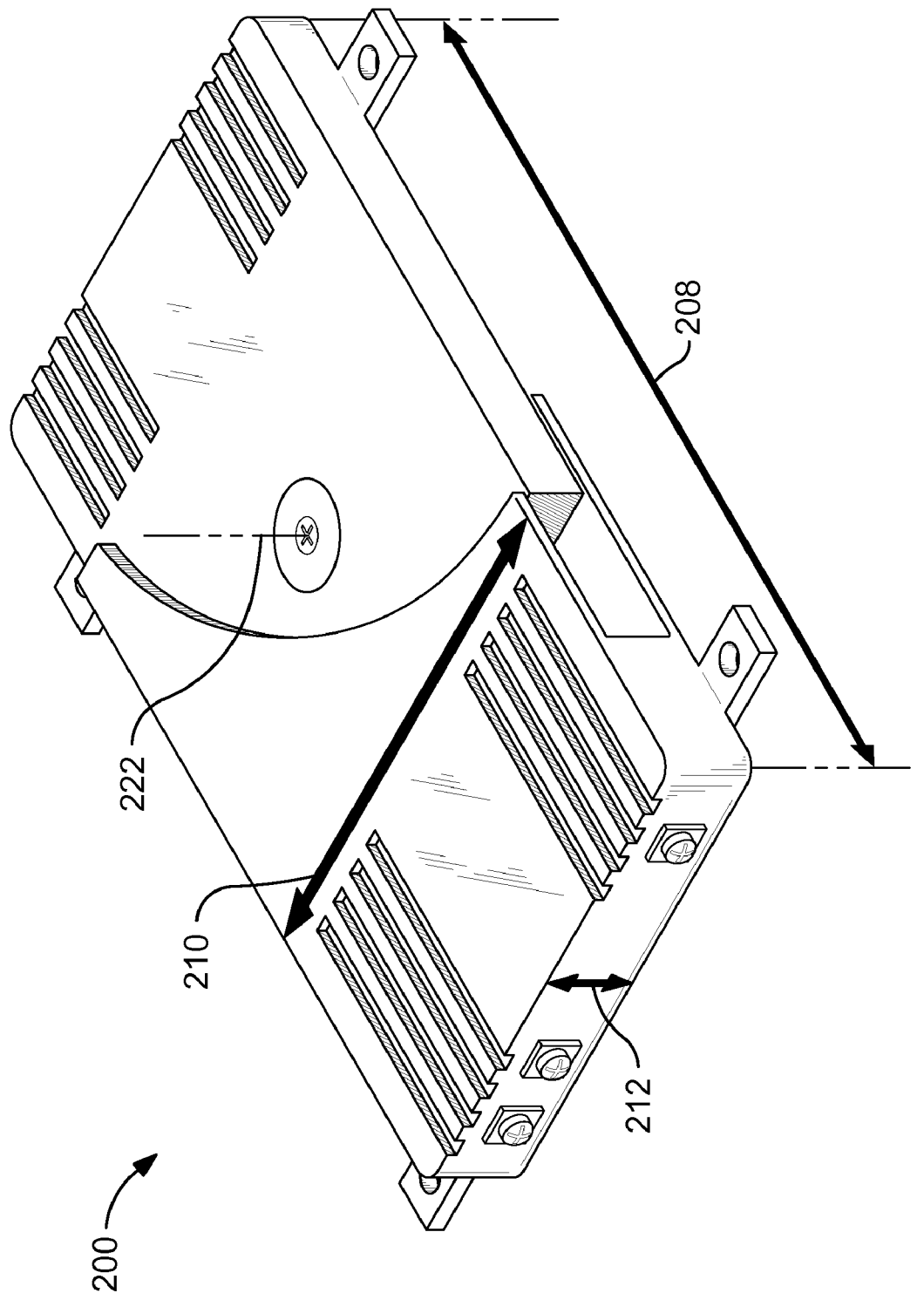
FIG. 6 is a diagrammatic perspective view of the amplifier of FIG. 4.

FIG. 4 shows an amplifier 200 according to at least one other aspect of the invention. The amplifier 200 has a first housing section 202, a second housing section 204, and a hinge 206. The amplifier 200 may also have the same functional internal components, mounting tabs or feet, and cooling fins as the amplifier 100. Because these components are structurally and functionally similar to their counterparts of the amplifier 100, redundant description is unnecessary. One significant difference between the amplifier 100 and the amplifier 200 is that in the latter, the hinge 206 is located, when considered in the plan view of FIG. 4, inside the periphery of the second housing section 204. Functionally, the hinge 206 may be identical to the hinge 106, including locking and releasing functions. The rotational axis 222 of the hinge 206, although displaced in location from the location of the hinge 106, may extend in the direction of the height 212 of the second housing section 204. The rotational axis 222, the length 208, the width 210, and the height 212 of the amplifier 200 are shown in FIG. 6.

Figure 5:
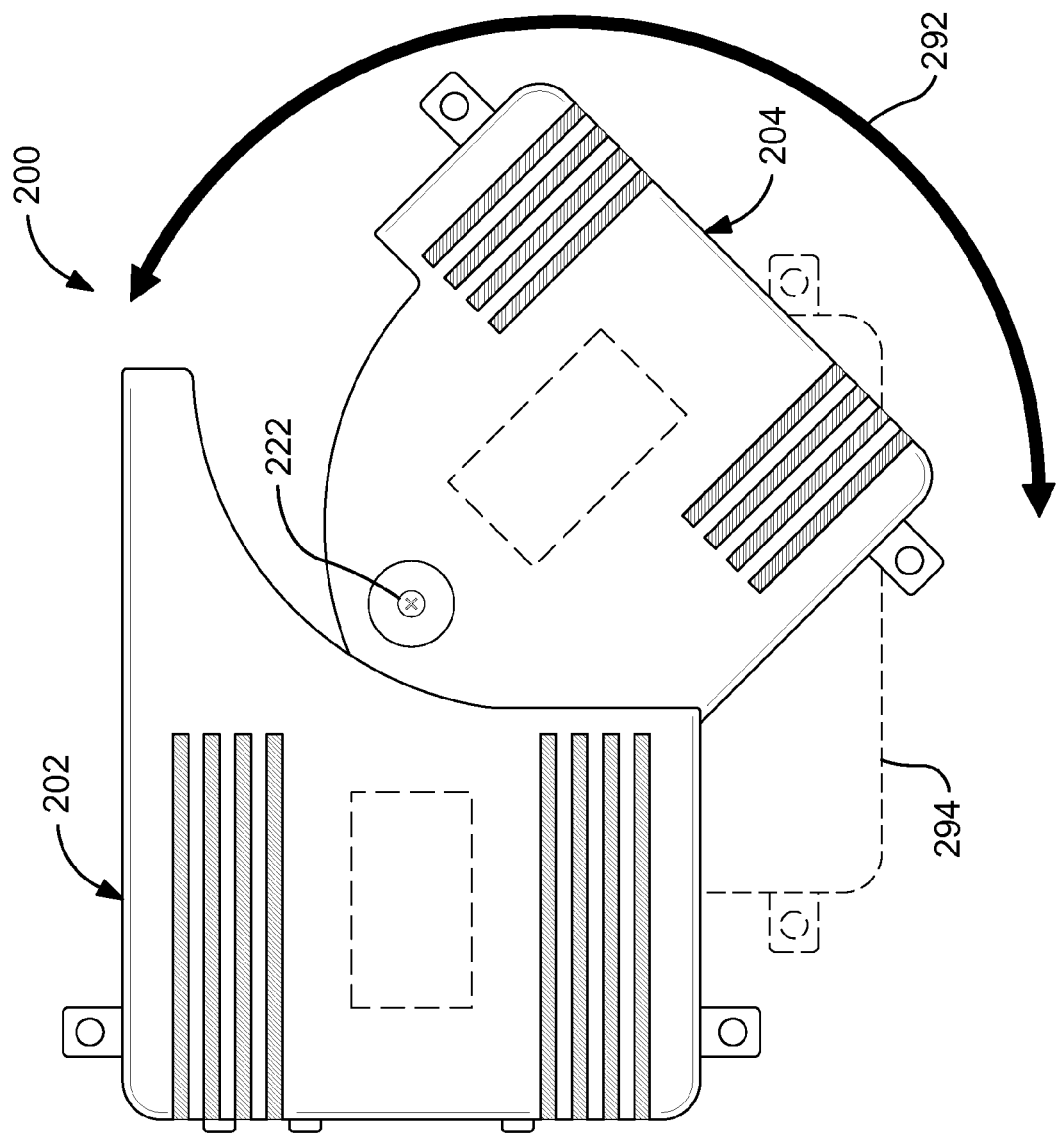
FIG. 5 is a top plan view of the amplifier of FIG. 4, showing an outer configuration which is adjusted from that shown in FIG. 4.

As seen in FIG. 5, the second housing section 204 can pivot about the rotational axis 222 throughout a range of adjustment represented by the arrow 292. This range may be extended such that the second housing section 204 may occupy the position indicated in the broken line 294 if desired.

A consequence of the arrangement of the amplifier 200 is that the overall footprint or configuration can be more compact than that of the amplifier 100. The outer housing sections 202 and 204 must be adapted so that a portion of one is received within the other as the second housing section 204 is pivoted. Of course, internal components of the receiving housing section 202 or 204 must be internally located to accommodate reception of the other housing section 204 or 202.

FIG. 8 shows an amplifier 300 according to another aspect of the invention. The amplifier 300 has a first housing section 302, a second housing section 304, and a hinge 306 having a rotational axis 322 which is aligned with the width dimension 310. For reference, the height dimension is shown as arrow 312, with the length (which is not designated by reference numeral) being the last remaining orthogonal direction. The hinge 306 may otherwise be similar in operation and function to the hinge 106, for example, having a setscrew 328 which selectively locks and releases the first and second housing section 302 and 304. As with the amplifier 200, the amplifier 300 may have the same functional internal components, mounting tabs or feet, and cooling fins as the amplifier 100. Because these components are structurally and functionally similar to their counterparts of the amplifier 100, redundant description is once again unnecessary.

The range of adjustment of the outer configuration of the amplifier 300, which is represented by the arrow 392 and which as drawn shows about a ninety degree angle, may range between zero degrees to more than one hundred eighty degrees. This enables mounting of the amplifier 300 on two adjacent environmental surfaces such as a floor surface 2 and a wall surface 4. Although the floor surface 2 and the wall surface 4 are shown as being mutually perpendicular, it will be apparent that the amplifier 300 can accommodate other mutual angles there between.

An amplifier according to one or more aspects of the invention, such as the amplifiers 100, 200 and 300, may have variations from the descriptions as presented herein. For example, locations and natures of mounting tabs such as the mounting tabs 138 . . . 144, of terminals such as the terminals 114, 116, 118, and of cooling fins such as the cooling fins 150 . . . 180 may be modified to suit. Terminals such as the terminals 114, 116, 118 may project into their respective housing sections such as the housing section 102 instead of projecting outwardly there from.

Cooling fins, such as the cooling fins 150 . . . 180, need not be part of a solid heat sink, such as the heat sink 182. Fins (not shown) may comprise part of a heat dissipating device such as a heat tube or heat pipe (not shown), which utilizes substances which go through repeating evaporation and condensing cycles as a vehicle of heat transfer. Such devices may be incorporated into an amplifier according to at least one aspect of the invention instead of or in addition to passive heat radiating devices such as the heat sink 182.

Also, components presented in the singular may be provided in the plural, and vice versa. Illustratively, conductors communicating between internal components, such as the cable 136, may comprise separate cables (not shown). Where feasible, it would be possible to provide a single component rather than a plurality of components. For example, separate mounting tabs such as the mounting tabs 138, 140 could be replaced by a single elongated tab (not shown) bearing a series of holes for receiving fasteners. Such an elongated tab may be straight, and located along only one edge of its associated housing section, such as the first housing section 102, or may be angled to extend along two or even three edges of the associated housing section.

Circuitry, which term is used only in a symbolic or representative sense herein, will be understood to comprise the number of conductors, and specific connection schemes necessary to carry out the described functions, as well as supporting apparatus such as terminals, connectors, switches, relays, transducers, circuit breakers, transformers, and voltage dividers, among others. Circuitry and any of its individual components may vary in size, number, location, and logic from that specifically shown or described herein.

The present invention is susceptible to modifications and variations which may be introduced thereto without departing from the inventive concepts. For example, although the invention has been described with respect to hinges, such as the hinge 106, rotatable hinges per se may be replaced by flexible tethers or other devices. Where sufficiently rugged to serve both purposes, the electrical cables which connect components of the first housing section, such as the first housing section 102, to those of the second housing section, such as the second housing section 104, may do dual duty as both satisfying needs of electrical connections, and also mechanically coupling the first housing section to the second housing section.

A hinge such as the hinge 106 may be replaced by other devices capable of rigidly holding a selected outer configuration or relative position of two housing sections such as the first housing section 102 and the second housing section 104. Illustratively, devices such as telescoping or otherwise adjustable lockable struts (not shown) may be provided.

It should be understood then that hinges such as the hinges 106, 206, 306, tethers (not shown), and other connectors of one housing section to the other housing sections, such as the first housing section 102 and the second housing section 104, may be regarded as housing connectors which are disposed to connect the first housing section to the second housing section in a plurality of mutual orientations.

While the present invention has been described in connection with what is considered the most practical and preferred embodiment, it is to be understood that the present invention is not to be limited to the disclosed arrangements, but is intended to cover various arrangements which are included within the spirit and scope of the broadest possible interpretation of the appended claims so as to encompass all modifications and equivalent arrangements which are possible.

I claim:

1. An amplifier which is adjustable as to outer configuration, comprising:

a first housing section;

a power supply which is dimensioned and configured to be received within and housed by the first housing section;

a second housing section;

an audio output module which is dimensioned and configured to be received within and housed by the second housing section;

a fixing element disposed to secure the first housing section to the second housing section in selected mutual orientations, and to release the first housing section and the second housing section from the selected mutual orientations; and a housing connector disposed to connect the first housing section to the second housing section in a plurality of mutual orientations, wherein the housing has an overall length, an overall width, and an overall height, wherein the overall height is less in magnitude than those of the overall length and the width, and wherein the overall height of the first housing section is about equal to that of the second housing section, and wherein the housing connector comprises a hinge and the fixing element comprises a setscrew which is accessible at the exterior of the amplifier, and which is dimensioned and configured to be driven by a screwdriver.

2. The amplifier of claim 1, further comprising flexible circuitry disposed to operably connect the power supply to the audio output module.

3. The amplifier of claim 1, further comprising electrical terminals disposed along the height of at least one of the first housing section and the second housing section.

4. The amplifier of claim 1, wherein
the first housing section comprises at least one mounting tab which projects from the first housing section in a direction perpendicular to the height of the first housing section and bears a hole for receiving a fastener; and
the second housing section comprises a mounting tab which projects from the second housing section in a direction perpendicular to the height of the second housing section and bears a hole for receiving a fastener.

5. The amplifier of claim 1, wherein the first housing section comprises a heat sink comprising a heat conductive substrate and a plurality of cooling fins projecting from the heat conductive substrate to the exterior of the first housing section, and the second housing section comprises a heat sink comprising a heat conductive substrate and a plurality of cooling fins projecting from the heat conductive substrate to the exterior of the second housing section.

6. The amplifier of claim 1, wherein the hinge comprises a rotational axis extending in the direction of the height of the first housing section and in the direction of the height of the second housing section.

7. The amplifier of claim 6, wherein the hinge is located at the periphery of the first housing section and at the periphery of the second housing section.

8. The amplifier of claim 6, wherein when viewed in plan such that the length and width of the first housing section and the length and width of the second housing section are seen, the hinge is located inside the periphery of one of the first housing section and the second housing section.

\* \* \* \* \*